US009118857B2

(12) United States Patent
Iwata et al.

(10) Patent No.: US 9,118,857 B2
(45) Date of Patent: Aug. 25, 2015

(54) SOLID-STATE IMAGING APPARATUS IN WHICH PLURAL TRANSISTORS ARE CONNECTED TO A SINGLE INITIALIZING SWITCH

(71) Applicant: CANON KABUSHIKI KAISHA, Tokyo (JP)

(72) Inventors: Koichiro Iwata, Kawasaki (JP); Kazuhiro Saito, Tokyo (JP); Kohichi Nakamura, Kawasaki (JP); Takeshi Akiyama, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 125 days.

(21) Appl. No.: 13/954,554

(22) Filed: Jul. 30, 2013

(65) Prior Publication Data

US 2014/0043511 A1    Feb. 13, 2014

(30) Foreign Application Priority Data

Aug. 10, 2012    (JP) ................. 2012-178366

(51) Int. Cl.
*H04N 5/374* (2011.01)
*H04N 5/378* (2011.01)
*H04N 5/369* (2011.01)
*H03F 3/45* (2006.01)

(52) U.S. Cl.
CPC .............. *H04N 5/3741* (2013.01); *H03F 3/45* (2013.01); *H04N 5/3698* (2013.01); *H04N 5/378* (2013.01)

(58) Field of Classification Search
None
See application file for complete search history.

(56) References Cited

U.S. PATENT DOCUMENTS

| 4,393,351 | A | * | 7/1983 | Gregorian et al. | ............. 327/337 |
|---|---|---|---|---|---|
| 4,404,525 | A | * | 9/1983 | Amir et al. | ......................... 330/9 |
| 5,880,630 | A | * | 3/1999 | Iwamoto et al. | .................. 330/9 |
| 7,528,878 | B2 | | 5/2009 | Sato et al. | ...................... 348/317 |
| 7,741,593 | B2 | | 6/2010 | Iwata et al. | ............... 250/214 R |
| 8,013,369 | B2 | | 9/2011 | Iwata et al. | ................... 257/290 |
| 8,081,245 | B2 | | 12/2011 | Itano et al. | ..................... 348/301 |
| 8,159,577 | B2 | | 4/2012 | Iwata et al. | ................... 348/296 |
| 8,218,049 | B2 | | 7/2012 | Sakakibara | .................... 348/308 |
| 8,451,360 | B2 | | 5/2013 | Nakamura et al. | ............ 348/308 |
| 8,462,243 | B2 | | 6/2013 | Sakakibara | .................... 348/302 |
| 8,553,118 | B2 | | 10/2013 | Saito et al. | ..................... 348/300 |
| 8,598,901 | B2 | | 12/2013 | Hiyama et al. | ............. 324/750.3 |
| 2009/0190018 | A1 | * | 7/2009 | Sakakibara | .................... 348/308 |
| 2010/0201856 | A1 | | 8/2010 | Hayashi et al. | ............... 348/296 |
| 2012/0119787 | A1 | * | 5/2012 | Sakuragi | ......................... 327/50 |
| 2013/0026343 | A1 | | 1/2013 | Saito et al. | ................. 250/208.1 |
| 2013/0057742 | A1 | | 3/2013 | Nakamura et al. | ............ 348/302 |

(Continued)

FOREIGN PATENT DOCUMENTS

JP    08-204509 A    8/1996

*Primary Examiner* — Justin P Misleh
(74) *Attorney, Agent, or Firm* — Fitzpatrick, Cella, Harper & Scinto

(57) ABSTRACT

A solid-state imaging apparatus includes: a plurality of first unit pixels configured to generate a signal by a photoelectric conversion; a first output line connected to the plurality of first unit pixels; and a first amplifier configured to amplify a signal from the first output line, wherein the first amplifier includes an operational amplifier (401), an initializing switch (404) having one terminal connected to an output terminal of the operational amplifier, and an offset adjusting unit (402) connected between the other terminal of the initializing switch and an input terminal of the operational amplifier, and the offset adjusting unit has a transistor having a source and a drain connected to each other.

9 Claims, 10 Drawing Sheets

(56) References Cited

U.S. PATENT DOCUMENTS

| | | | |
|---|---|---|---|
| 2013/0062503 A1 | 3/2013 | Saito et al. | 250/208.1 |
| 2013/0068930 A1 | 3/2013 | Nakamura et al. | 250/208.1 |
| 2013/0088292 A1 | 4/2013 | Maehashi et al. | 330/125 R |
| 2013/0088625 A1 | 4/2013 | Iwata et al. | 348/300 |
| 2013/0100322 A1 | 4/2013 | Noda et al. | 348/294 |

\* cited by examiner

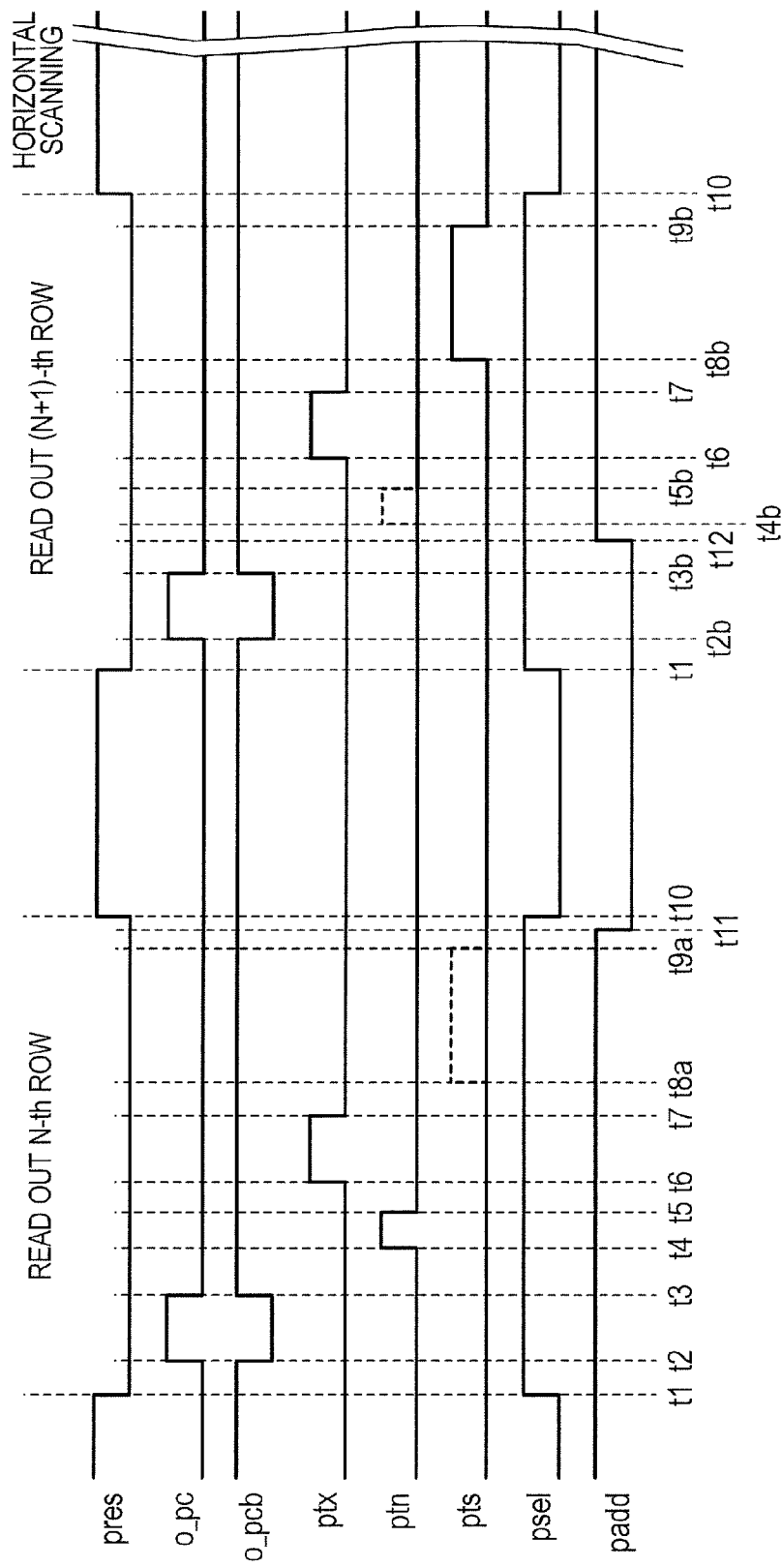

SOLID-STATE IMAGING APPARATUS IN WHICH PLURAL TRANSISTORS ARE CONNECTED TO A SINGLE INITIALIZING SWITCH

BACKGROUND OF THE INVENTION

1. Field of the Invention

The present invention relates to a solid-state imaging apparatus.

2. Description of the Related Art

The solid-state imaging apparatus in recent years is used in various equipment such as a digital camera, a digital video camera and a mobile telephone, and is required to have higher functionalities. There is a strong request for a greater number of pixels in particular, and it is essential to downsize the pixel and the read out circuit for reading the signal of the pixel. When downsizing the read out circuit which is configured to have an amplifier circuit using a feedback type capacitor in every column, it becomes necessary to reduce the capacitance values. In this case, an offset increases which originates in injected charges due to the charge injection which occurs when the amplifier circuit is initialized. The following method is known as a method of reducing the charge injection and a clock feed-through which occur when the amplifier circuit using the feedback type capacitor is initialized.

A dummy transistor which short-circuits its source and its drain is connected between a reset switch and a negative input terminal of an inversion amplifier circuit. At this time, a pulse which is applied to the gate of the dummy transistor is an inversion pulse of the pulse which controls the reset switch. This pulse makes the charge injection and the clock feed-through to be absorbed in the channel of the dummy transistor.

As an example of the above described technique, Japanese Patent Application Laid-Open No. H08-204509 is known. However, the above described offset cancellation method has a possibility that the offset cannot be reduced to a designed value due to the variation in the manufacture of the transistor, for instance.

SUMMARY OF THE INVENTION

According to an aspect of the present invention, a solid-state imaging apparatus includes: a plurality of first unit pixels configured to generate a signal by a photoelectric conversion; a first output line connected to the plurality of first unit pixels; and a first amplifier configured to amplify a signal from the first output line, wherein the first amplifier includes an operational amplifier, an initializing switch having one terminal connected to an output terminal of the operational amplifier, and an offset adjusting unit connected between the other terminal of the initializing switch and an input terminal of the operational amplifier, and the offset adjusting unit has a transistor having a source and a drain connected to each other.

Further features of the present invention will become apparent from the following description of exemplary embodiments with reference to the attached drawings.

BRIEF DESCRIPTION OF THE DRAWINGS

FIG. 13 is a driving timing diagram of the solid-state imaging apparatus of the second embodiment.

DESCRIPTION OF THE EMBODIMENTS

First Embodiment

Figure 1:
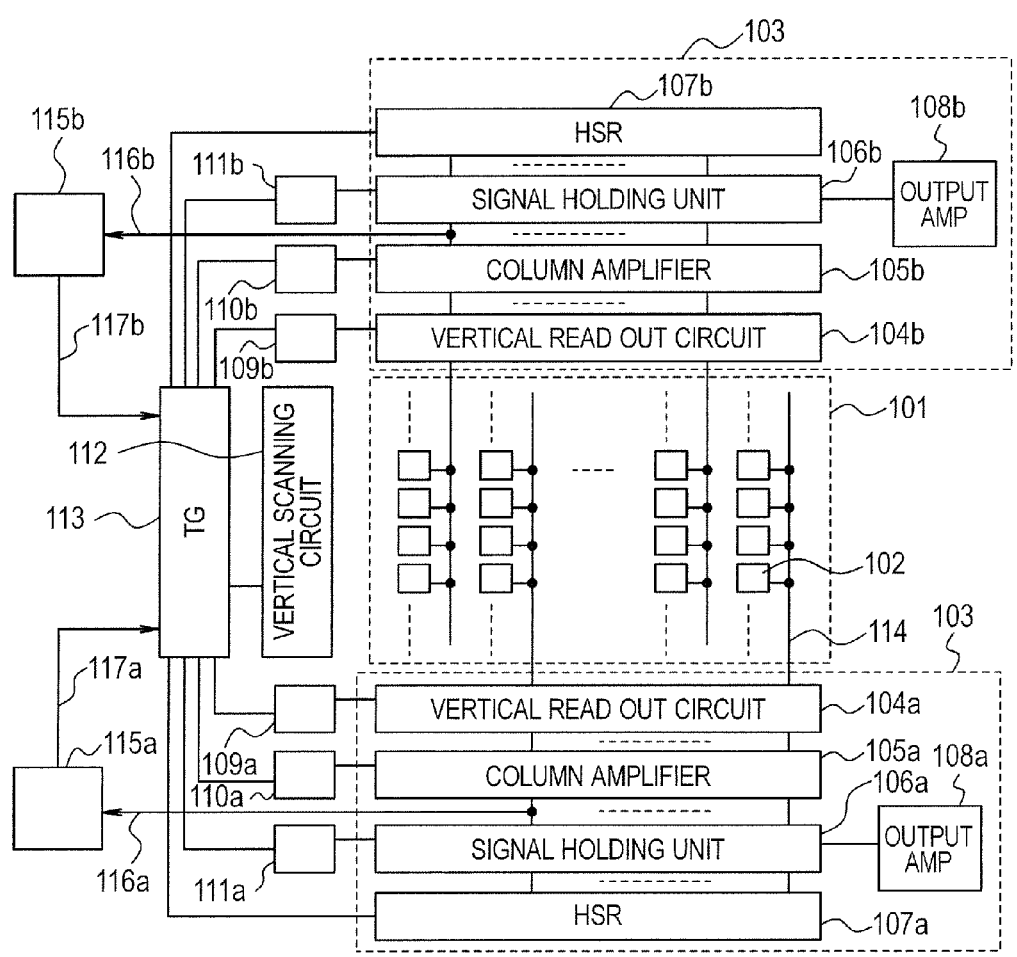
FIG. 1 is a block diagram of a solid-state imaging apparatus of first and second embodiments.

FIG. 1 is a block diagram illustrating a configuration example of a solid-state imaging apparatus according to a first embodiment of the present invention. A photoelectric conversion region 101 has unit pixels 102 arranged therein in a matrix form. To a vertical output line 114, the plurality of the unit pixels 102 are connected. The unit pixel 102 generates a signal by photoelectric conversion. A read out circuit block 103 below the photoelectric conversion region 101 has a vertical read out circuit 104a, a column amplifier (first amplifier) 105a, a signal holding unit 106a, a horizontal shift register 107a and an output amplifier 108a; and reads out signals of first unit pixels 102 in odd columns. The first unit pixels 102 in the odd columns are connected to first vertical output lines (first output lines) 114 in the odd columns. The read out circuit block 103 above the photoelectric conversion region 101 has a vertical read out circuit 104b, a column amplifier (second amplifier) 105b, a signal holding unit 106b, a horizontal shift register 107b and an output amplifier 108b; and reads out signals of second unit pixels 102 in even columns. The second unit pixels 102 in the even columns are connected to second vertical output lines (second output lines) 114 in the even columns. A driver 109a controls the vertical read out circuit 104a, and a driver 109b controls the vertical read out circuit 104b. A driver 110a controls the column amplifier 105a, and a driver 110b controls the column amplifier 105b. A driver 111a controls the signal holding unit 106a, and a driver 111b controls the signal holding unit 106b. A vertical scanning circuit 112 sequentially scans the two-dimensionally arrayed unit pixels 102 in a vertical direction. A timing generator (TG) 113 controls each circuit block, and can independently control each of the drivers 109 to 111. An offset-cancelling degree automatically-adjusting unit 115a inputs an output signal 116a of the column amplifier 105a thereinto, and outputs an output signal 117a to the timing generator 113. Similarly, an offset-cancelling degree automatically-adjusting unit 115b inputs an output signal 116b of the column amplifier 105b thereinto, and outputs an output signal 117b to the timing generator 113. In FIG. 1, the drivers 109, 110 and 111 are illustrated as different circuit blocks, but may be formed into one circuit block. In addition, an A/D converter may also be provided so as to correspond to each column amplifier 105, in order to convert an analog signal which has been amplified by the column amplifier 105 to a digital signal.

Figure 2:
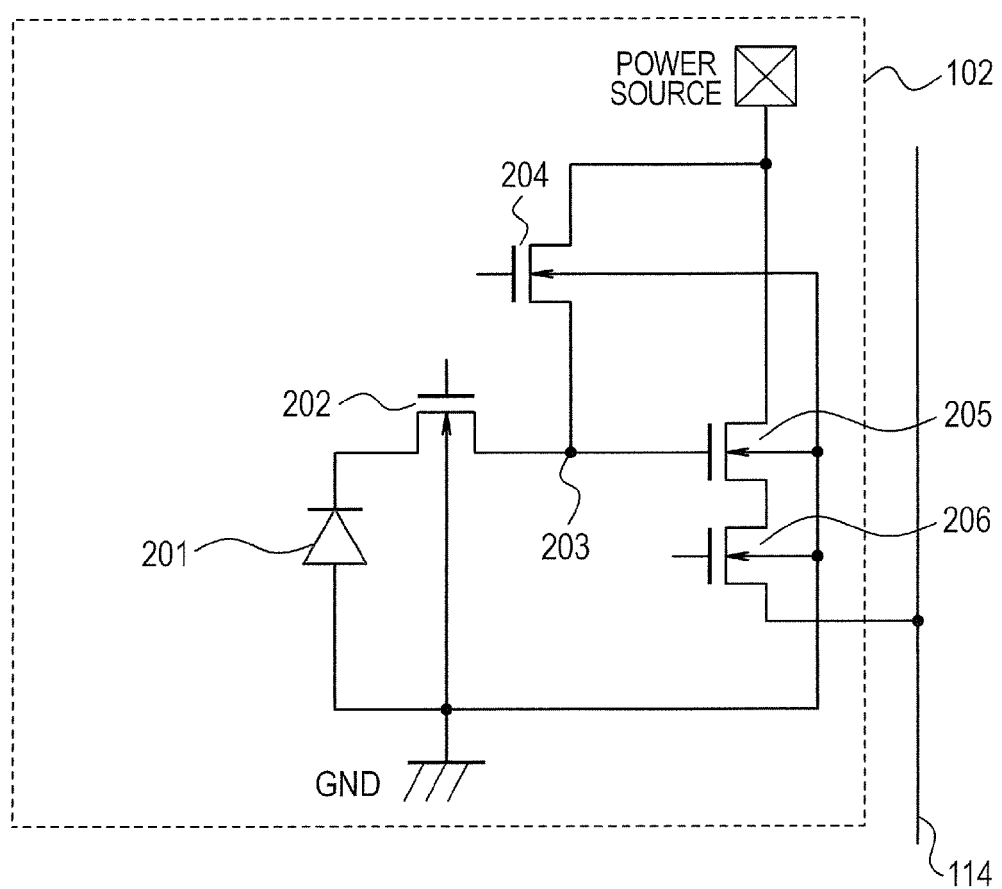
FIG. 2 is a circuit diagram of a unit pixel of the first and second embodiments.

FIG. 2 is a circuit diagram illustrating a configuration example of the unit pixel 102 in FIG. 1. A photoelectric conversion element 201 converts light into an electric charge (electron). A transfer MOS transistor 202 transfers an electric charge which has been generated in the photoelectric conversion element 201 to a floating portion 203. A reset MOS transistor 204 resets the potential of the floating portion 203 to a predetermined level. When the electric charge of the photoelectric conversion element 201 is reset, the transistors 204 and 202 may be simultaneously turned on. An amplifying MOS transistor 205 operates as a source follower of which the potential of the source changes according to the potential of the floating portion 203, while co-operating with a not-shown current source provided on the vertical output line 114. A selecting MOS transistor 206 connects the source of the amplifying MOS transistor 205 to the vertical output line 114. When the selecting MOS transistor 206 in the row which is desired to be read out is turned on, the signal of the photoelectric conversion element 201, which is desired to be read out, can be read out to the vertical output line 114.

Figure 3:
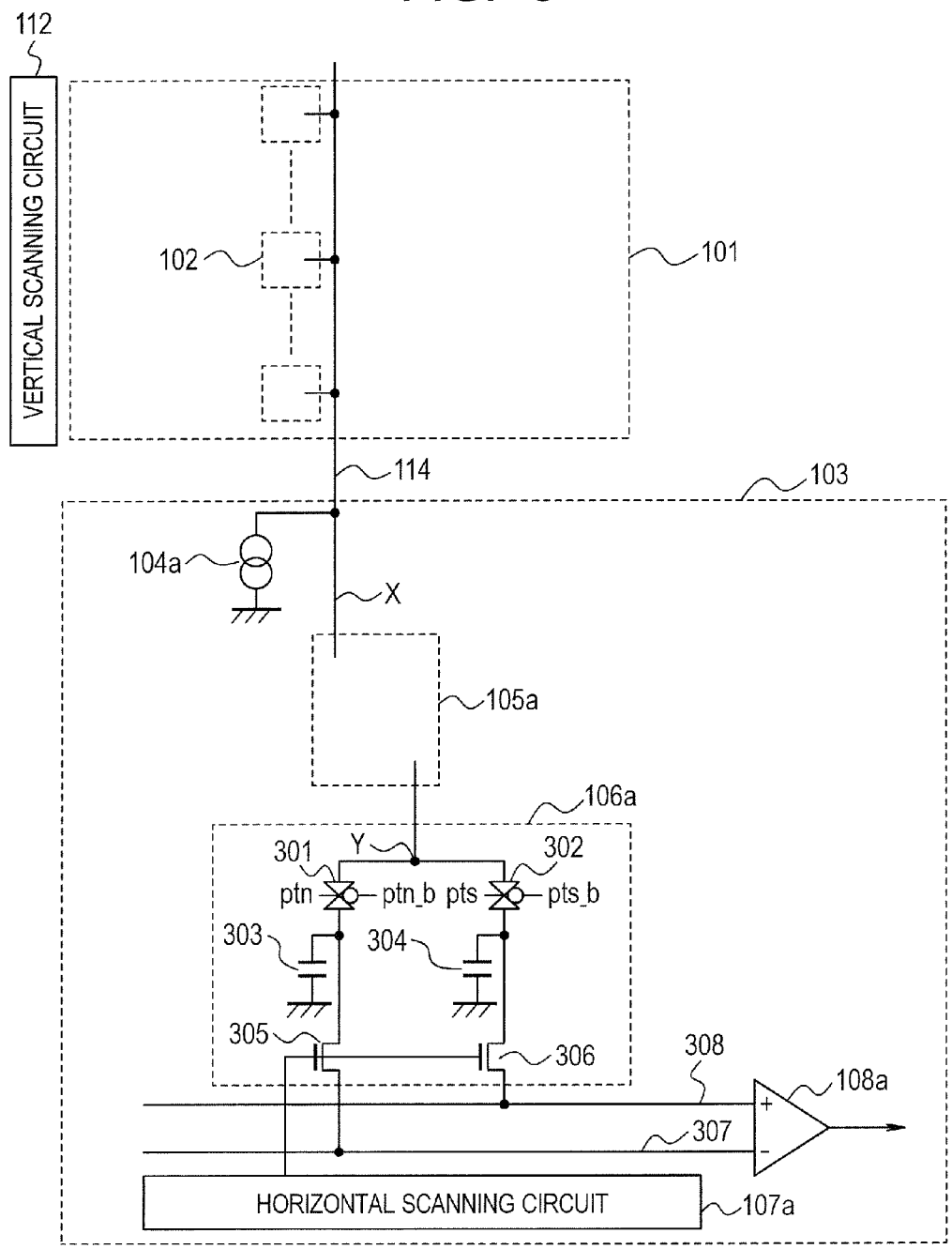
FIG. 3 is an equivalent circuit diagram for one column in a read out circuit of the first and second embodiments.

FIG. 3 is a circuit diagram illustrating a configuration example for one column in the read out circuit block 103 in FIG. 1. The vertical-line read out circuit 104a is a current source working as a load of the amplifying MOS transistor 205. The potential of the vertical output line 114 is determined by the current value of this current source 104a and the gate voltage of the amplifying MOS transistor 205. The column amplifier 105a amplifies the voltage of a node X of the vertical output line 114, and outputs the amplified voltage to a node Y of the signal holding unit 106a. The signal holding unit 106a has switches 301 and 302, an N-signal holding capacitor 303, an S-signal holding capacitor 304, and switches 305 and 306. The N-signal holding capacitor 303 holds the potential (noise signal) of the vertical output line 114, which has been amplified by the column amplifier 105a, when the floating portion 203 of the unit pixel 102 has been reset. The S-signal holding capacitor 304 holds the potential (pixel signal) which appears in the vertical output line 114 after the electric charge that has been generated in the photoelectric conversion element the 201 of the unit pixel 102 and amplified by the column amplifier 105a has been transferred to the floating portion 203. A horizontal scanning circuit 107a turns the switches 305 and 306 on, and transfers each of the signals of the N-signal holding capacitor 303 and the S-signal holding capacitor 304 to horizontal transfer lines 307 and 308, respectively, in a horizontal transfer period of time after the N-signal holding capacitor 303 and the S-signal holding capacitor 304 have held the signals. The output amplifier 108a differentially amplifies the noise signal of the horizontal transfer line 307 and the pixel signal of the horizontal transfer line 308, and outputs the differentially amplified signal.

Figure 4:
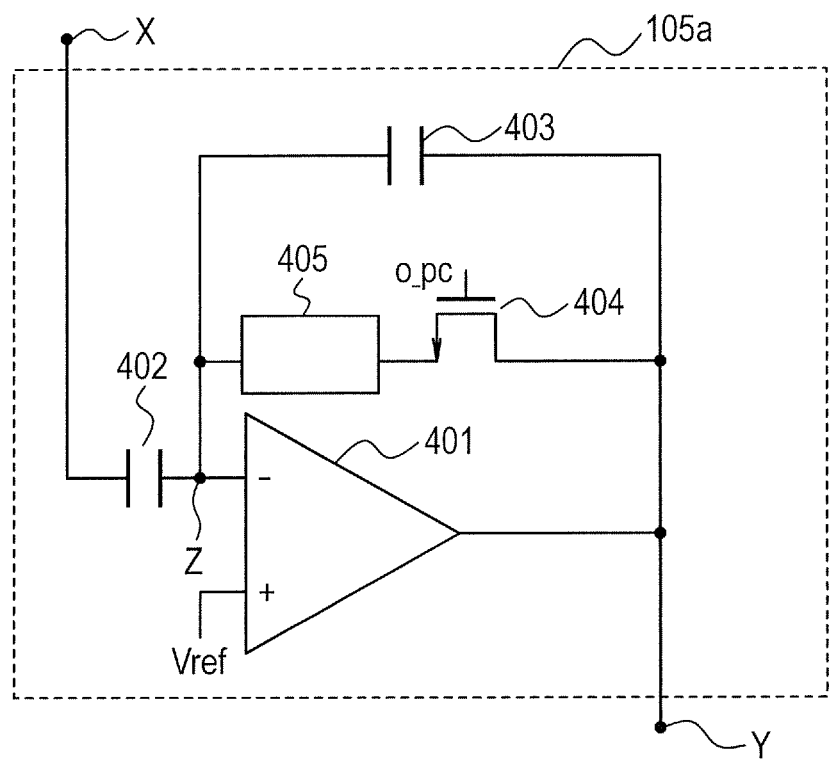
FIG. 4 is a circuit diagram of a column amplifier of the first embodiment.

FIG. 4 is a circuit diagram illustrating a configuration example of the column amplifier 105a. The column amplifier 105b also has a similar configuration to that of the column amplifier 105a. An input capacitor 402 is connected between a node X and an inversion input terminal of an operational amplifier (differential amplifier) 401, and clamps the potential of the vertical output line 114. A feedback capacitor 403 is connected between the inversion input terminal and the output terminal of the operational amplifier 401. The gain of the column amplifier 105a is determined by a ratio of the capacitance values between the feedback capacitor 403 and the input capacitor 402. An initializing MOS transistor 404 is an initializing switch for initializing the input capacitor 402, and is controlled by a control signal o_pc. The initializing MOS transistor 404 has one end connected to the output terminal of the operational amplifier 401. An offset adjusting unit 405 is connected between the other end of the initializing MOS transistor 404 and the inversion input terminal of the operational amplifier 401. The circuit in which the offset adjusting unit 405 and the initializing MOS transistor 404 are serially connected is connected between the inversion input terminal and the output terminal of the operational amplifier 401. A non-inversion input terminal of the operational amplifier 401 is connected to a reference potential Vref. The output terminal of the operational amplifier 401 is connected to the node Y.

Figure 5:
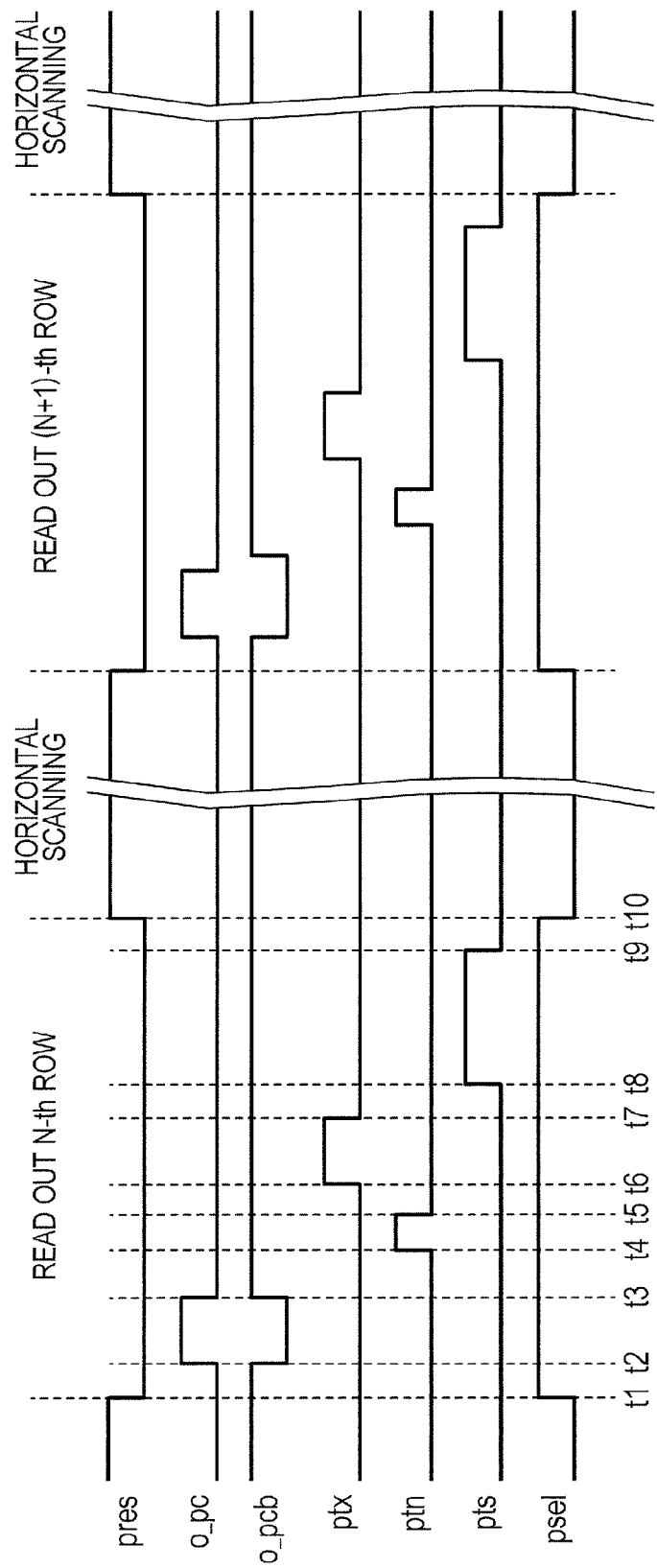
FIG. 5 is a driving timing diagram of the solid-state imaging apparatus of the first embodiment.

FIG. 5 is a timing chart illustrating a method for driving the solid-state imaging apparatus according to the present embodiment. A signal pres is a pulse for controlling the reset MOS transistor 204 in FIG. 2. The signal o_pc is a pulse for controlling the initializing MOS transistor 404 in FIG. 4. A signal o_pcb is a pulse for controlling the offset adjusting unit 405 in FIG. 4. A signal ptx is a pulse for controlling the transfer MOS transistor 202 in FIG. 2. A signal ptn is a pulse for controlling a switch 301 in FIG. 3. A signal pts is a pulse for controlling a switch 302 in FIG. 3. A signal psel is a pulse for controlling the selecting MOS transistor 206 in FIG. 2.

Before the time t1, the signal pres becomes a high level, the reset MOS transistor 204 is turned on, and the floating portion 203 is in a state of being reset to a power source voltage.

At the time t1, the signal pres for the row to be read out becomes a low level, and the reset MOS transistor 204 is turned off. Thereby, the floating portion 203 becomes a floating node. At this time, the signal psel for the row to be read out becomes a high level, and the selecting MOS transistor 206 is turned on. Thereby, the source of the amplifying MOS transistor 205 is connected to the vertical output line 114 through the selecting MOS transistor 206. The amplifying MOS transistor 205 starts passing an electric current of the current source 104a connected to the vertical output line 114. The potential of the vertical output line 114 at this time is determined by the gate potential of the amplifying MOS transistor 205. Specifically, the potential of the vertical output line 114 is fixed to a potential which has been lowered by a threshold voltage Vth and an overdrive voltage $\Delta$Vov of the amplifying MOS transistor 205, from the potential of the floating portion 204.

At the time t2, the signal o_pc becomes a high level. Thereby, the initializing MOS transistor 404 of the column amplifier 105a is turned on, and the potential of the vertical output line 114 which has been determined by the potential of the reset floating portion 203 is clamped by the input capacitor 402. At the time t2, the signal o_pcb is also shifted, but the signal o_pcb will be described in detail when the offset adjusting unit 405 will be described, and accordingly the description is omitted at the moment.

At the time t3, the signal o_pc becomes a low level, and the initializing MOS transistor 404 of the column amplifier 105a is turned off. The charge injection and the clock feed-through which occur at this time increase the offset of the column amplifier 105a.

At the time t4, the signal ptn becomes a high level, the switch 301 is turned on, and the output signal (N signal) of the column amplifier 105a when the amplifier has been initialized is written into the N-signal holding capacitor 303.

At the time t5, the signal ptn becomes a low level, and writing of the N signal into the N-signal holding capacitor 303 ends.

At the time t6, the signal ptx becomes a high level, the transfer MOS transistor 202 is turned on, and the electrons which have been generated by photoelectric conversion in the photoelectric conversion element 201 are transferred to the floating portion 203. The voltage of the floating portion 203 is lowered from the voltage of the resetting time, by the transferred electrons. Due to the lowering, the potential of the vertical output line 114 is lowered. The lowered potential of the vertical output line 114 is inverted and amplified by the column amplifier 105a. The gain of the amplification after inversion occurring at this time is determined by a ratio between the input capacitor 402 and the feedback capacitor 403. The amplified signal of the photoelectric conversion element 201 shall be referred to as an S signal.

At the time t7, the signal ptx becomes a low level, the transfer MOS transistor 202 is turned off, and the transfer of the electrons to the floating portion 203 from the photoelectric conversion element 201 ends.

At the time t8, the signal pts becomes a high level, the switch 302 is turned on, and the S signal which has been amplified by the column amplifier 105a is written into the S-signal holding capacitor 304.

At the time t9, the signal pts becomes a low level, the switch 302 is turned off, and writing of the S signal into the S-signal holding capacitor 304 ends.

At the time t10, the signal psel becomes a low level, the selecting MOS transistor 206 is turned off, and the unit pixel 102 is separated from the vertical output line 114.

After that, horizontal scanning is started. The horizontal scanning circuit 107a sequentially outputs signals for turning the switches 305 and 306 on. When signals of a high level are supplied to the switches 305 and 306 from the horizontal scanning circuit 107a, the signal held in the N-signal holding capacitor 303 is transferred to the horizontal transfer line 307, and the signal held in the S-signal holding capacitor 304 is transferred to the horizontal transfer line 308. The horizontal transfer line 308 is connected to a forward input terminal of the output amplifier 108a, and the horizontal transfer line 307 is connected to the inversion input of the output amplifier 108a. Then, the output amplifier 108a outputs a voltage obtained by subtracting the N signal from the S signal.

When the horizontal transfer period of time has ended, the procedure shifts to the sequence of reading out the next row. The sequence of reading out the next row is a procedure of repeating the above described operations.

Figure 6:
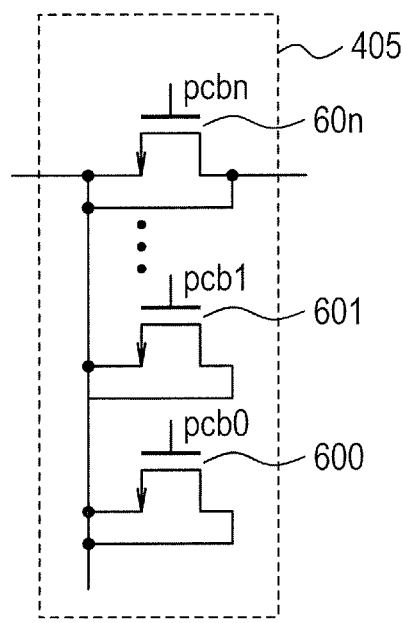
FIG. 6 is a circuit diagram of an offset adjusting unit of the first and second embodiments.

FIG. 6 is a circuit diagram illustrating a configuration example of the offset adjusting unit 405. Each of dummy MOS transistors 600, 601 to 60n absorbs the electric charge which has been redistributed during the charge injection, in the channel. The source and the drain of each of the transistors 600 to 60n are connected to each other, and are connected to the inversion input terminal of the operational amplifier 401 in FIG. 4. The offset adjusting unit 405 has arbitrary n pieces of dummy MOS transistors 600 to 60n therein. Signals pcb0 to pcbn are input into the gates of the dummy MOS transistors 600 to 60n, respectively. The signals pcb0 to pcbn change the number of the driven dummy MOS transistors 600 to 60n, control the gate size of the dummy MOS transistors 600 to 60n, and thereby change the quantity of absorption for the electric charges which have been redistributed by the charge injection.

Figure 7:
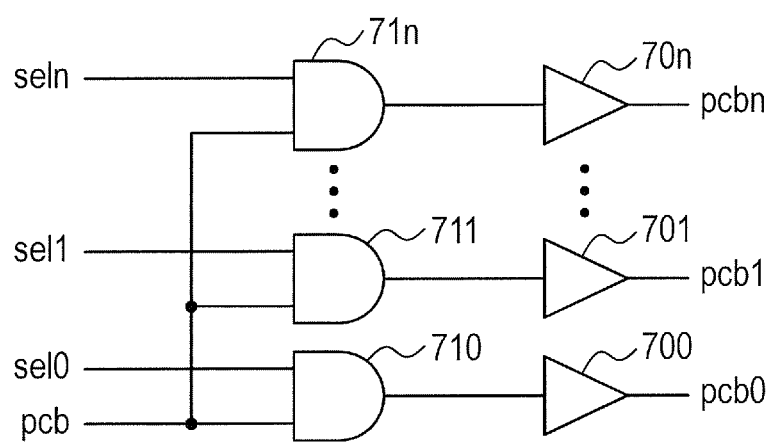
FIG. 7 is a circuit diagram of a part of a control unit of the first and second embodiments.

FIG. 7 is a circuit diagram illustrating a configuration example of a part of a driver 110a for controlling the offset adjusting unit 405 in FIG. 6. Buffer circuits 700, 701 to 70n drive the dummy MOS transistors 600, 601 to 60n in FIG. 6, respectively. Conjunction (AND) circuits 710, 711 to 71n determine whether to operate the buffer circuits 700, 701 to 70n or not, respectively. The conjunction circuits 710, 711 to 71n obtain conjunctions between the signal pcb and respective signals sel0, sel1 to seln. The signals sel0, sel1 to seln are signals that determine to which dummy MOS transistor the control signal pcb is applied among the dummy MOS transistors 600, 601 to 60n. When each of the signals sel0 to seln becomes a high level, the signal pcb is transmitted to the buffer circuits 700 to 70n, and is applied to the gates of the dummy MOS transistors 600 to 60n as the control signals pcb0 to pcbn, respectively. When each of the signals sel0 to seln becomes a low level, the signal pcb is not transmitted to the buffer circuits 700 to 70n, and the control signals pcb0 to pcbn are not applied to the gates of the dummy MOS transistors 600 to 60n, respectively.

The amount of electric charges to be absorbed in the offset adjusting unit 405 is determined by the following expression (1).

$$Q[C] = C_{ox} \times W \times L \times V_{gs} \tag{1}$$

Here, Cox represents gate capacitance per unit area, W represents a gate width of the dummy MOS transistor, L represents a gate length of the dummy MOS transistor, and Vgs represents a voltage between the gate and the source of the dummy MOS transistor.

The size of the dummy MOS transistors 600, 601 to 60n is approximately 1/10 of the size of the initializing MOS transistor 404 in the column amplifier 105a, for instance. At this time, suppose that n is 9 and there are 10 pieces of dummy MOS transistors in total. In this case, the amount of absorbable electric charges is between 0 and Cox×W×L×Vgs [C], and the minimum adjusting range is expressed by the following expression (2).

$$\tfrac{1}{10} \times C_{ox} \times W \times L \times V_{gs} [C] \tag{2}$$

The quantity of the redistribution of the generally said charge injection is said to be expressed by the following expression (3), with respect to the source and the drain of the initializing MOS transistor 404 in the column amplifier 105a.

$$Q1[C] = \tfrac{1}{2} \times C_{ox} \times W1 \times L1 \times V_{gs}1 \tag{3}$$

Here, W1 represents a gate width of the initializing MOS transistor 404, L1 represents a gate length of the initializing MOS transistor 404, and Vgs1 represents a voltage between the gate and the source of the initializing MOS transistor 404.

In addition, the following expression (4) holds, and accordingly in the present embodiment, even when the offset becomes a positive value or a negative value, the offset can be adjusted so as to be canceled.

$$1/2 \times C_{ox} \times W1 \times L1 \times V_{gs}1 \\ = 1/10 \times 5 \times C_{ox} \times W \times L \times V_{gs}(V_{gs}1 = V_{gs}) \tag{4}$$

Figure 8A:
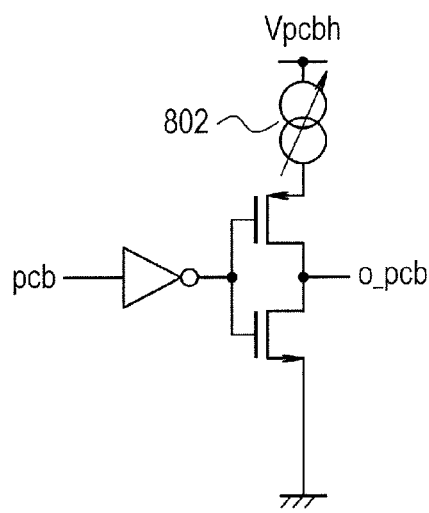
FIGS. 8A and 8B are circuit diagrams of a driver of the first and second embodiments.
Figure 10:
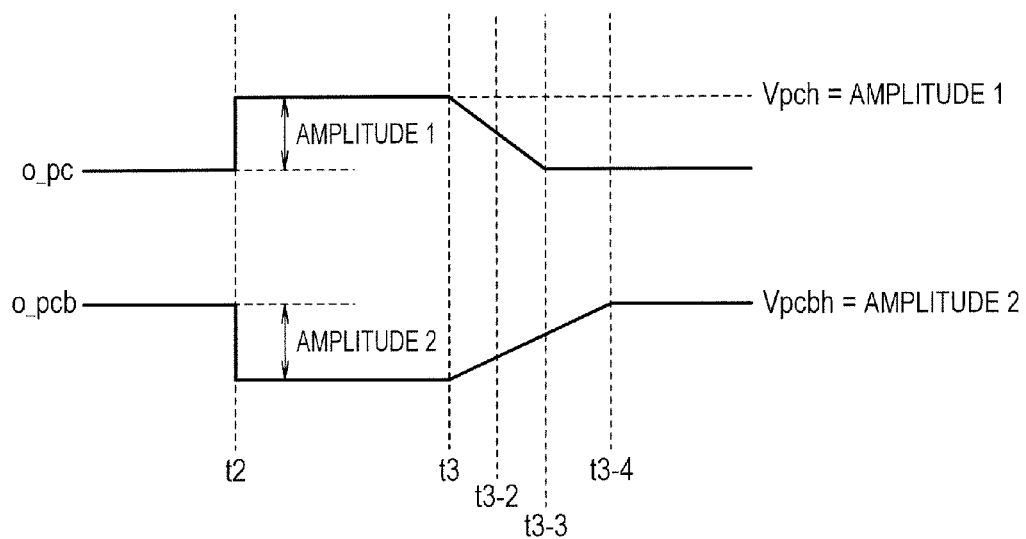
FIG. 10 is a pulse diagram of the first and second embodiments.

FIG. 8A is a circuit diagram illustrating a configuration example of buffer circuits 700, 701 to 70n in FIG. 7. The buffer circuits 700, 701 to 70n input the signal pcb thereinto, and output the signal o_pcb. A current source 802 is connected between the source of a PMOS transistor of an inverter and the node of a power source voltage Vpcbh. By changing the current value of this current source 802, the control unit can control the gradient of the rise of the signal o_pcb as is illustrated in FIG. 10. The current source 802 can be set so as to be valid/invalid, and when the current source 802 has been set to be invalid, the circuit operates as if to have no current source 802 therein.

Figure 8B:
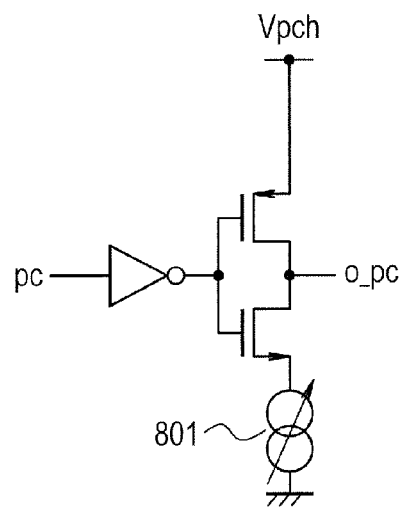

FIG. 8B is a circuit diagram illustrating a configuration example of the buffer circuit in the driver 110a, and this buffer circuit outputs the signal o_pc to the gate of the initializing MOS transistor 404 in FIG. 4. This buffer circuit inputs a signal pc thereinto, and outputs the signal o_pc. The signal pc is an inverted signal of the signal pcb. The current source 801 is connected between the source of the NMOS transistor of the inverter and the ground potential node. By changing the current value of this current source 801, the driver 110a can control the gradient of the fall of the signal o_pc as is illustrated in FIG. 10. The current source 801 can be set so as to be valid/invalid, and when the current source 801 has been set to be invalid, the circuit operates as if to have no current source 801 therein.

The solid-state imaging apparatus has the drivers 110a and 110b arranged in one side of the column amplifiers 105a and 105b, respectively, as is illustrated in FIG. 1. Accordingly, the delay periods of time of the signals o_pc and o_pcb are different between places close to and far from the drivers 110a and 110b. Thereby, a difference of the offset occurs between the left side and the right side. When the fall and the rise of the pulses of the signals o_pc and o_pcb are controlled, respectively, the delay periods of time can be thereby reduced and the difference of the offset between the left side and the right side can be reduced.

As is illustrated in FIG. 10, the signal o_pc rises up to a power source voltage (high level) Vpch from a low level at the time t2, and starts falling toward the low level from the power source voltage (high level) Vpch at the time t3. At the time t3-2, the voltage Vgs of the initializing MOS transistor 404 becomes a threshold voltage Vth or lower, and the channel of the initializing MOS transistor 404 disappears. At the time t3-3, the signal o_pc becomes a low level.

On the other hand, the signal o_pcb starts falls down to the low level from a power source voltage (high level) Vpcbh at the time t2, and starts rising toward the power source voltage (high level) Vpcbh from the low level at the time t3. At the time t3-2, the voltage Vgs of the dummy MOS transistors 600, 601 to 60n becomes the threshold voltage Vth. A channel is generated at the time t3-2 when the channel of the initializing MOS transistor 404 has disappeared, or thereafter. At the time t3-4, the signal o_pcb becomes the power source voltage (high level) Vpcbh.

As described above, the variation of the offset cancelling degree in the horizontal direction can be reduced when the channel of the dummy MOS transistors 600, 601 to 60n is generated after the channel of the initializing MOS transistor 404 has disappeared. Accordingly, the signals o_pc and o_pcb can be controlled so that the channel of the dummy MOS transistors is generated after the channel of the initializing MOS transistor 404 has disappeared.

Figure 9:
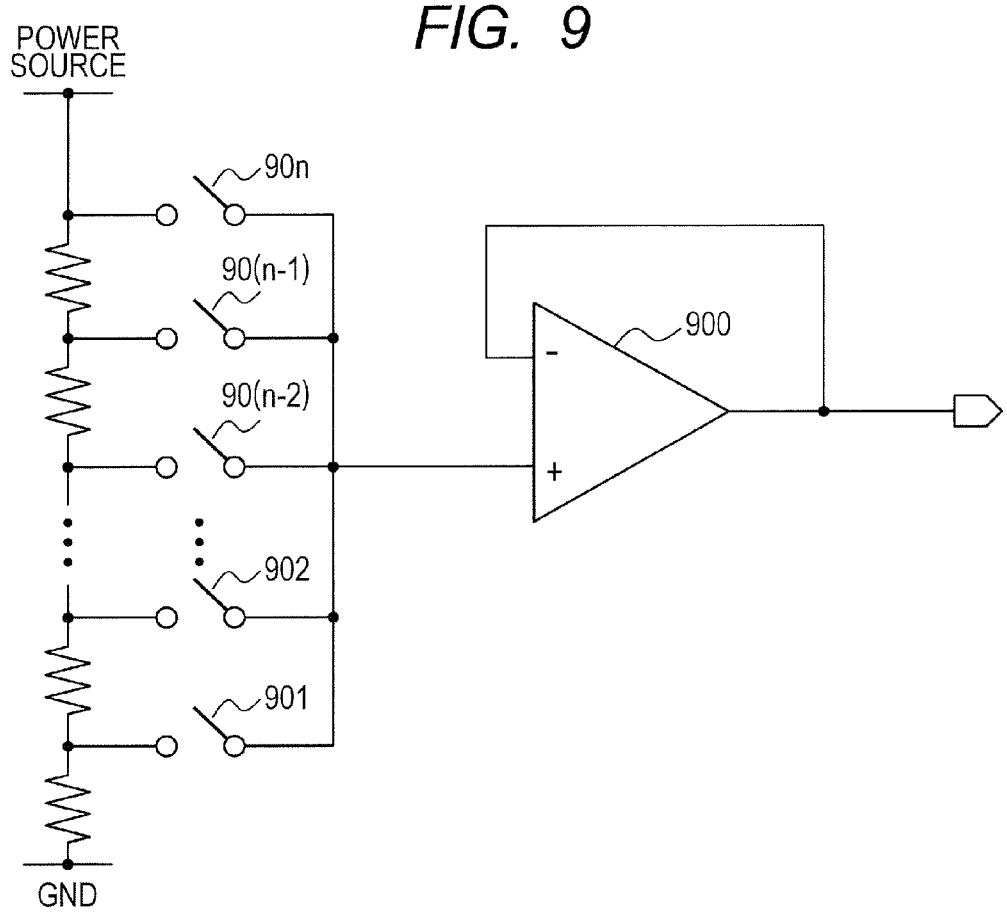
FIG. 9 is a circuit diagram of a power source supply in the driver of the first and second embodiments.

FIG. 9 is a view illustrating a configuration example of a power source circuit for generating a power source voltage Vpcbh in FIG. 8A or a power source voltage Vpch in FIG. 8B. The high-level voltages Vpch and Vpcbh of the respective control signals o_pc and o_pcb can be changed and controlled by using the power source circuit in FIG. 9. The power source circuit in FIG. 9 has two circuits of a power source circuit for the power source voltage Vpcbh in FIG. 8A, and a power source circuit for the power source voltage Vpch in FIG. 8B. For information, the power source circuits equal to the number of the read out circuit blocks 103 may be each independently prepared.

A unity gain buffer 900 has the inversion input terminal which is connected to the output terminal. Any one of switches 901, 902 to 90 (n−2), 90 (n−1) and 90n is turned on. Thereby, any voltage which has been divided by any resistances that are connected between the power source voltage node and the ground potential node is supplied to a forward input terminal of the unity gain buffer 900. The output terminal of the unity gain buffer 900 is connected to the node of the power source voltage Vpcbh in FIG. 8A or the power source voltage Vpch in FIG. 8B. Thereby, the power source circuit can change the high-level Vpch and Vpcbh of the respective signals o_pc and o_pcb in FIG. 10.

Changing the high-level Vpch and Vpcbh of the respective signals o_pc and o_pcb leads to changing the voltage Vgs of the initializing MOS transistor 404 or the dummy MOS transistors 600, 601 to 60n. In other words, the power source circuit can control the amount of the electric charges in the channel in which the electric charges are redistributed or the amount of the electric charges to be absorbed in the channel of the dummy MOS transistors 600, 601 to 60n.

In the present embodiment, the following controls are conducted: (1) the control for the number of the dummy MOS transistors 600, 601 to 60n; (2) the control of turning the signal o_pc to the high level; and (3) the control of turning the signal o_pcb to the high level. Thereby, the cancelling degree of the charge injection, in other words, the offset degree of the output from the column amplifiers 105a and 105b can be adjusted. The offset may be adjusted by conducting the above described controls (1) to (3) at the same time, by using any one control or by using any two controls.

Figure 11:
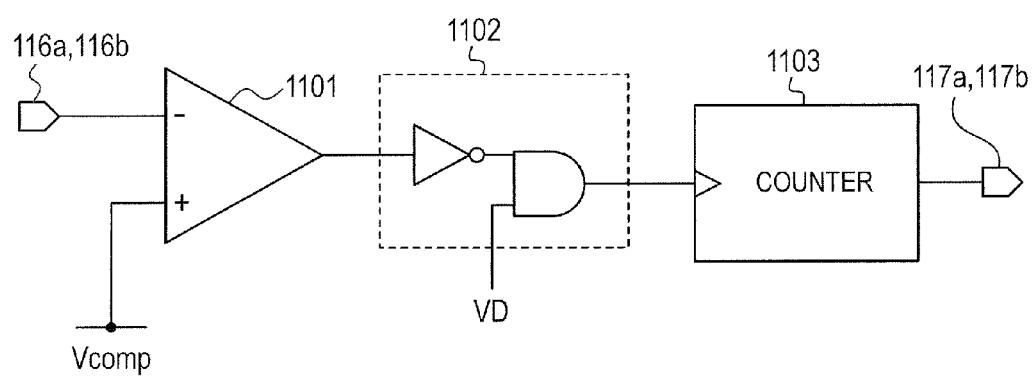
FIG. 11 is a circuit diagram of an offset-cancelling degree automatically-adjusting unit.

FIG. 11 is a view illustrating a configuration example of offset-cancelling degree automatically-adjusting units 115a and 115b. An arbitrary reference voltage Vcomp is input into a forward input terminal of a comparator 1101, and an output signal 116a or 116b of the column amplifier 105a or 105b is input into an inversion input terminal thereof. The output signal 116a or 116b at this time is output by using the column amplifier 105a or 105b of the column which outputs the level of an optical black pixel in which the unit pixel 102 is shaded. The initial state of a calibration is started in the state in which the offset cancelling degree is not adjusted. In the present embodiment, the initializing MOS transistor 404 is an NMOS transistor, and accordingly the output offset of the column amplifier 105a or 105b becomes plus in the state in which the offset is not canceled. A detailed adjusting method will be described below.

A logic circuit 1102 continues supplying a pulse VD which is input once during one vertical scanning period (1 V), to a clock terminal of a counter 1103, until the output of the comparator 1101 is inverted. The count value of the counter 1103 is input into a timing generator 113, as the output signal 117a or 117b. The timing generator 113 outputs the offset-cancellation adjusting degree which corresponds to the counter value, to drivers 110a and 110b, as control signals sel1 to seln in FIG. 7.

As described above, until the output signal 116a or 116b of the column amplifier 105a or 105b becomes lower than the reference voltage Vcomp and the output signal of the comparator 1101 is inverted, the counter 1103 counts up and increases the offset-cancellation adjusting degree. The offset of plus is reduced by this operation. If the reference voltage Vcomp of the comparator 1101 has been set at the same voltage as that of the reference potential Vref of the column amplifiers 105a and 105b, the offset can be adjusted so that the output signals 116a and 116b of the column amplifiers 105a and 105b come to the vicinity of the reference potential Vref.

In the present embodiment, each of the driver 110a and the driver 110b may differently control the column amplifiers, or may control the column amplifiers in the same way. Specifically, the offset adjusting unit 405 of the column amplifier 105b can adjust the offset cancelling degree so as to be different from that of the offset adjusting unit 405 of the column amplifier 105a. It is also possible as another adjustment method to measure an offset degree at the time of the shipment of a semiconductor chip, and to set a set value for cancelling the offset degree for every semiconductor chip.

Second Embodiment

Figure 12:
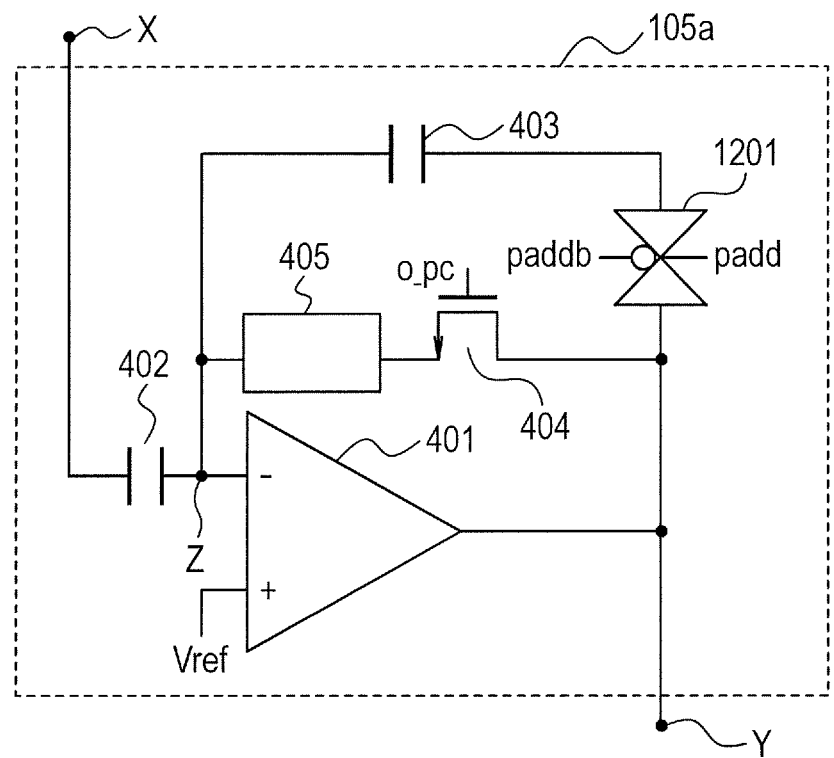
FIG. 12 is a circuit diagram of a column amplifier of the second embodiment.

FIG. 12 is a circuit diagram illustrating a configuration example of the column amplifier 105a according to the second embodiment of the present invention. The column amplifier 105b also has a similar configuration to that of the column amplifier 105a. Hereafter, a point will be described in which the present embodiment is different from the first embodiment. The column amplifier 105a of FIG. 12 has a switch 1201 which is added to the column amplifier 105a of FIG. 4. The switch 1201 is connected between a feedback capacitor 403 and a node Y, and is a switch for adding a signal by using the feedback capacitor 403 in an addition mode. The switch 1201 is controlled by a control signal padd and an inverted signal paddb thereof. In a non-addition mode, if the switch 1201 has been always set at an on state, the column amplifier 105a can operate as has been described in the first embodiment.

FIG. 13 is a timing chart illustrating a method for driving a solid-state imaging apparatus according to the present embodiment. Hereafter, the point will be described in which the timing chart of FIG. 13 is different from the timing chart of FIG. 5. As previously described, the signal padd is a pulse which controls the switch 1201 in FIG. 12. The signal paddb which is another pulse for controlling the switch 1201 is the inverted signal of the signal padd, and accordingly is not illustrated in FIG. 13.

At the time t8a to t9a, a signal pts is kept at a low level and a switch 302 is kept in an off state. Therefore, an S signal of an N-th row is not written into an S-signal holding capacitor 304.

During the time t11 to t12, the signal padd becomes a low level, and the switch 1201 is turned off. Thereby, an S signal which has been amplified during the time t6 to t7 is held in the feedback capacitor 403. During the time t2b to t3b while the switch 1201 is turned off, a signal o_pc becomes a high level and the column amplifiers 105a and 105b are initialized. At this time, the switch 1201 is turned off, and accordingly the S signal of the N-th row is not reset, which is held in the feedback capacitor 403. The S signal of the N-th row becomes a voltage Vout1s which is expressed by the following expression (5) that includes the offset in the column amplifier at the time when the N-th row is read out.

$$Vout1s = Vs1 + Vofs \quad (5)$$

Here, the Vs1 is a signal which is generated by amplifying an S signal of an N-th row with the column amplifier 105a or 105b, and the Vofs is an output offset of the column amplifier 105a or 105b.

At the time t3b, the signal o_pc becomes a low level, and resetting for the column amplifiers 105a and 105b for reading out an (N+1)-th row ends. At this time, an offset due to a charge injection at the time when the column amplifiers 105a and 105b are reset appears in the outputs of the column amplifiers 105a and 105b.

At the time t12, the signal padd becomes a high level, and the switch 1201 is turned on. Thereby, the output voltage Vout2n of the column amplifiers 105a and 105b becomes a voltage which is generated by superimposing the offset Vofs of the column amplifier of an (N+1)-th row on an S signal Vs of an N-th row, as in the following expression (6).

$$Vout2n = Vs + Vofs \quad (6)$$
$$= (Vs1 + Vofs) + Vofs$$
$$= Vs1 + 2Vofs$$

During the time t4b to t5b, the outputs of the column amplifiers 105a and 105b at the time are in a level which includes the S signal of the N-th row. Accordingly, the signal ptn is kept at a low level, and the signal is not written into the N-signal holding capacitor 303. At this time, the signal Vout1n which is held in the N-signal holding capacitor 303 is expressed by the following expression (7).

$$Vout1n = Vofs \quad (7)$$

During the time t6 to t7 within a period for reading out an (N+1)-th row, an S signal of the (N+1)-th row is read out and is amplified by the column amplifier 105a or 105b. The output voltage Vout2 of the column amplifier 105a or 105b at this time is expressed by the following expression (8).

$$Vout2s = Vs1 + Vs2 + 2Vofs \quad (8)$$

Here, the Vs2 is a signal which has been generated by amplifying the S signal of the (N+1)-th row with the column amplifier 105a or 105b.

During the time t8b to t9b, the signal pts becomes a high level, the switch 302 is turned on, and a voltage Vout2s is written into the S-signal holding capacitor 304.

After that, the switches 305 and 306 are turned on during a horizontal transfer period, and the signals which have been held in the N-signal holding capacitor 303 and the S-signal holding capacitor 304 are read out by the horizontal transfer lines 307 and 308, respectively, are differentially amplified by an output amplifier 108a and 108b, and are output.

The output voltage at this time is expressed by the following expression (9).

$$G \times (Vout2s - Vout1n) \quad (9)$$
$$= G \times (Vs1 + Vs2 + Vofs)$$

Here, the G is expressed by the following expression (10).

$$G = Gamp \times C1/(C1+C2) \quad (10)$$

Here, the Gamp is a gain of the output amplifier 108a or 108b, C1 is a capacitance of the holding capacitor 303 or 304, and C2 is a parasitic capacitance of the horizontal transfer line 307 or 308. When the Gamp is 1, and an N signal and an S signal have been transferred to the horizontal transfer lines 307 and 308, the G becomes 1 time or less due to the parasitic capacitance of the horizontal transfer lines 307 and 308.

As is understood from the expression (8), in the operation method of the present embodiment, the column amplifier offset Vofs equal to two times are superimposed on the output voltages of the column amplifiers 105a and 105b. When addition by the feedback capacitors 403 of the column amplifiers 105a and 105b is not conducted as in the first embodiment, and when an offset is not canceled, an offset corresponding to just the offset Vofs occurs in the column amplifiers 105a and 105b. In other words, it becomes necessary to change the adjusting degree of the offset cancelling degree according to the difference in a driving method (difference in operational mode). For instance, in the driving method of the addition mode of the present embodiment, twice offset occurs compared to the driving method in the non-addition mode of the first embodiment, and accordingly the adjusting degree of the cancelling degree may be set so as to be twice as large as that of the first embodiment.

Thus, an offset adjusting unit 405 can secure the same dynamic range in every operational mode by changing the offset cancelling degree according to the operational mode. In addition, also when the feedback capacitor 403 is configured to be variable and the column amplifiers 105a and 105b are configured to have variable gains, the offset degree which appears in the output changes. Accordingly, it is advantageous to change an adjustment value of the offset cancelling degree for every gain setting (every mode).

Note that the above embodiments are merely examples how the present invention can be practiced, and the technical scope of the present invention should not be restrictively interpreted by the embodiments. In other words, the present invention can be practiced in various ways without departing from the technical concept or main features of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-178366, filed on Aug. 10, 2012, which is hereby incorporated by reference herein in its entirety.

What is claimed is:

1. A solid-state imaging apparatus comprising:
a plurality of first unit pixels configured to generate a signal by a photoelectric conversion;
a first output line connected to the plurality of first unit pixels; and
a first amplifier configured to amplify a signal from the first output line, the first amplifier comprising an operational amplifier, an initializing switch having one terminal and another terminal, the one terminal being connected to an output terminal of the operational amplifier, and a plurality of transistors connected between the another terminal of the initializing switch and an input terminal of the operational amplifier, each of the plurality of transistors having a source and a drain connected to each other, wherein
the plurality of transistors are collectively connected to the another terminal of the initializing switch.

2. The solid-state imaging apparatus according to claim 1, further comprising a power source circuit configured to control a high-level voltage of a control signal of the initializing switch.

3. The solid-state imaging apparatus according to claim 1, further comprising a power source circuit configured to control a high-level voltage of a control signal supplied to a gate of the transistors connected between the another terminal of the initializing switch and the input terminal of the operational amplifier.

4. The solid-state imaging apparatus according to claim 1, further comprising a driver configured to control a gate size of the transistors connected between the another terminal of the initializing switch and the input terminal of the operational amplifier.

5. The solid-state imaging apparatus according to claim 1, further comprising
a plurality of second unit pixels configured to generate a signal by a photoelectric conversion;
a second output line connected to the plurality of second unit pixels; and
a second amplifier configured to amplify a signal from the second output line, the second amplifier comprising an operational amplifier, an initializing switch having one terminal connected to an output terminal of the operational amplifier, and an offset adjusting unit connected between the another terminal of the initializing switch and an input terminal of the operational amplifier, wherein
the offset adjusting unit of the second amplifier has a transistor having a source and a drain connected to each other.

6. The solid-state imaging apparatus according to claim 5, wherein the offset adjusting unit changes an offset cancelling degree according to an operation mode.

7. The solid-state imaging apparatus according to claim 5, wherein the solid-state imaging apparatus has addition mode and a non-addition mode, and an adjusting degree of the offset adjusting unit in the addition mode is larger than an adjusting degree of the offset adjusting unit in the non-addition mode.

8. The solid-state imaging apparatus according to claim 1, wherein the plurality of transistors have gates that are respectively supplied with distinct control signals.

9. The solid-state imaging apparatus according to claim 1, further comprising a control signal supplying unit including an input node receiving a control signal, and a plurality of selecting portions, each arranged correspondingly to each of the plurality of transistors, and each selecting as to whether the control signal is inputted to each of the plurality of transistors.

* * * * *